(12) United States Patent
Gao et al.

(10) Patent No.: US 12,144,132 B2
(45) Date of Patent: Nov. 12, 2024

(54) DISPLAY APPARATUS AND DISPLAY DEVICE

(71) Applicant: BOE Technology Group Co., Ltd., Beijing (CN)

(72) Inventors: Biao Gao, Beijing (CN); Lu Liu, Beijing (CN); Hong Zhu, Beijing (CN); Ziang Han, Beijing (CN); Zongyuan Wang, Beijing (CN); Xiaofei Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 183 days.

(21) Appl. No.: 17/801,270

(22) PCT Filed: Nov. 19, 2021

(86) PCT No.: PCT/CN2021/131600
§ 371 (c)(1),
(2) Date: Aug. 22, 2022

(87) PCT Pub. No.: WO2022/160878
PCT Pub. Date: Aug. 4, 2022

(65) Prior Publication Data
US 2023/0098597 A1    Mar. 30, 2023

(30) Foreign Application Priority Data
Jan. 28, 2021   (CN) .......................... 202110118963.1

(51) Int. Cl.
*H05K 5/02*   (2006.01)
(52) U.S. Cl.
CPC .................................. *H05K 5/0217* (2013.01)
(58) Field of Classification Search
CPC ... H05K 5/0217; G06F 1/1651; G06F 1/1624; G06F 1/1637
See application file for complete search history.

(56) References Cited

U.S. PATENT DOCUMENTS 10,868,264 B2 * 12/2020 Shin ....................... H10K 59/65
11,012,546 B1 *  5/2021 Song ..................... G06F 1/1656
(Continued)

FOREIGN PATENT DOCUMENTS

CN        109872639 A      6/2019
CN        110428741 A     11/2019
(Continued)

OTHER PUBLICATIONS

International Search Report for PCT/CN2021/131600 Mailed Feb. 23, 2022.
(Continued)

*Primary Examiner* — Sagar Shrestha
(74) *Attorney, Agent, or Firm* — Ling Wu; Stephen Yang; Ling and Yang Intellectual Property (57) ABSTRACT

A display apparatus and a display device, the display apparatus includes a first housing, a second housing, and a flexible display screen disposed on the first housing and the second housing; the flexible display screen includes a roll-up portion and a fixing portion that are connected to one another, the roll-up portion is at least partially disposed on the second housing, the fixing portion is at least partially disposed on the first housing, the second housing is slidably connected to the first housing, and at least part of the roll-up portion can slide out of or slide into the first housing following the second housing; a supporting structure is provided between at least part of the roll-up portion and the second housing, and the supporting structure provides a supporting force for the roll-up portion.

9 Claims, 5 Drawing Sheets

(56) References Cited

U.S. PATENT DOCUMENTS

| | | | |
|---|---|---|---|
| 11,042,195 B1* | 6/2021 | Hong | H04M 1/0268 |
| 11,497,130 B2* | 11/2022 | Song | G06F 1/1624 |
| 2013/0058063 A1* | 3/2013 | O'Brien | G06F 1/1624 |
| | | | 361/807 |
| 2018/0097197 A1* | 4/2018 | Han | H05K 5/03 |
| 2018/0103550 A1 | 4/2018 | Seo et al. | |
| 2018/0103552 A1* | 4/2018 | Seo | H05K 5/0017 |
| 2019/0348629 A1* | 11/2019 | Hu | G06F 1/1637 |
| 2020/0363841 A1* | 11/2020 | Kim | G06F 1/1626 |
| 2021/0048738 A1 | 2/2021 | Ren et al. | |
| 2021/0103314 A1* | 4/2021 | Ko | H04M 1/0237 |
| 2021/0181801 A1* | 6/2021 | Yin | G06F 1/1652 |
| 2021/0242420 A1 | 8/2021 | Luo et al. | |
| 2022/0113765 A1* | 4/2022 | Kang | G06F 1/16 |
| 2022/0121244 A1* | 4/2022 | Kwon | G09G 5/005 |
| 2022/0155823 A1* | 5/2022 | Shin | G09F 9/301 |
| 2022/0240400 A1* | 7/2022 | Zhou | G09F 9/301 |
| 2023/0116984 A1* | 4/2023 | Feng | G09F 9/301 |
| | | | 361/807 |
| 2023/0273645 A1* | 8/2023 | Kwon | H04M 1/72454 |
| | | | 361/679.01 |
| 2023/0288955 A1* | 9/2023 | Park | G06F 1/1616 |
| 2023/0325214 A1* | 10/2023 | Bae | G06F 3/04886 |
| 2023/0393623 A1* | 12/2023 | Wang | G06F 1/1652 |
| 2024/0103580 A1* | 3/2024 | Seo | G06F 1/1656 |

FOREIGN PATENT DOCUMENTS

| | | |
|---|---|---|
| CN | 209708516 U | 11/2019 |
| CN | 209930305 U | 1/2020 |
| CN | 210324969 U | 4/2020 |
| CN | 111508355 A | 8/2020 |
| CN | 111968503 A | 11/2020 |
| CN | 212411481 U | 1/2021 |
| CN | 112908169 A | 6/2021 |
| CN | 214897341 U | 11/2021 |
| KR | 10-2018-0040181 A | 4/2018 |
| WO | 2019153256 A1 | 8/2019 |

OTHER PUBLICATIONS

Office Action dated Jun. 15, 2022 for Chinese Patent Application No. 202110118963.1 and English Translation.

* cited by examiner

DISPLAY APPARATUS AND DISPLAY DEVICE

CROSS-REFERENCE TO RELATED APPLICATIONS

The present application is a U.S. National Phase Entry of International Application PCT/CN2021/131600 having an international filing date of Nov. 19, 2021, which claims priority of Chinese patent application No. 202110118963.1, filed to CNIPA on Jan. 28, 2021 and entitled "Display Apparatus and Display Device", and the contents disclosed in the above-mentioned application are hereby incorporated as a part of this application.

TECHNICAL FIELD

The present disclosure relates to, but is not limited to, the field of display technology, in particular to a display apparatus and a display device.

BACKGROUND

With the development of display panel technology, a screen can be folded and bent to a certain extent by use of good flexible characteristics of flexible display screen, and then a technology for realizing extension and expansion of a terminal display screen through scroll function is further developed. At present, a stretchable or sildable display device with the flexible display screen design is provided with a sliding plate, which is capable of translating and stretching on a fixed plate with respect to the fixed plate, and the flexible display screen is disposed on the fixed plate and the sliding plate, such that the adjustable extension and expansion of the display screen is accomplished.

However, when the sliding plate is stretched relative to the fixed plate, there is a segment difference in a height direction of the two stacked plates, therefore a stamping problem of the flexible display screen will easily occur at the segment difference, and support flatness of a stretched part of the flexible display screen cannot be ensured.

SUMMARY

The following is a summary of subject matter described herein in detail. The summary is not intended to limit the protection scope of claims.

A display apparatus includes a first housing, a second housing and a flexible display screen disposed on the first housing and the second housing respectively. The flexible display screen includes a rolling portion and a fixed portion connected with each other, the rolling portion is at least partially disposed on the second housing, the fixed portion is at least partially disposed on the first housing, the second housing is slidably connected with the first housing, and the rolling portion can at least partially slide out of or into the first housing following the second housing. A support structure is disposed between at least a part of the rolling portion and the second housing, and the support structure provides a support force for the rolling portion, such that when the rolling portion slides out of the first housing, a surface of the rolling portion away from the second housing is flushed with a surface of the fixed portion away from the first housing.

In an exemplary embodiment, the support structure includes at least one rigid support strip whose extension direction is perpendicular to a stretching direction of the flexible display screen.

In an exemplary embodiment, the support structure includes at least two rigid support strips, the rigid support strips are arranged side by side along the stretching direction of the flexible display screen, and a rolling space is formed between adjacent rigid support strips.

In an exemplary embodiment, internal angles formed between two opposite side surfaces of a rigid support strip in the stretching direction of the flexible display screen and a surface of the rolling portion are obtuse angles, such that a rolling space is formed between the side surfaces of adjacent rigid support strips.

In an exemplary embodiment, the rigid support strip at least has a first surface located at a side of the rigid support strip close to the rolling portion and fixedly connected with the rolling portion, and the first surfaces of adjacent rigid support strips form a support surface providing a support force for the rolling portion.

In an exemplary embodiment, the first surface is planar.

In an exemplary embodiment, the rigid support strip further has a second surface located at a side of the rigid support strip close to the second housing and is slidably connected with the second housing.

In an exemplary embodiment, the second surface is provided with at least one fixing block, and one side of the second housing close to the fixed portion of the flexible display screen is provided with a clamping groove. When the rolling portion slides out of the first housing, the fixing block can be embedded in the clamping groove to limit movement of the rolling portion in a direction away from the second housing.

In an exemplary embodiment, the fixing block includes a support member and a buckle disposed at one side of the support member away from the second surface, wherein the buckle can be embedded in the clamping groove to limit the movement of the rolling portion in the direction away from the second housing.

In an exemplary embodiment, the second surface is provided with one fixing block located at the middle of the rigid support strip in a direction perpendicular to the stretching direction of the flexible display screen.

In the exemplary embodiment, a tensioning member and a winding assembly arranged in the housing are further included, one end of the tensioning member is connected with one end of the rolling portion away from the fixed portion, and the other end of the tensioning member is connected with the winding assembly.

In an exemplary embodiment, the rolling portion includes a back film that includes a rollable portion and a non-rollable portion connected to each other, a modulus of a material of the rollable portion is less than that of a material of the non-rollable portion.

In an exemplary embodiment, the material of the rollable portion has a modulus of 2 GPa to 5 GPa, and the material of the non-rollable portion has a modulus of 6 GPa to 15 GPa.

A display device is provided, including the display apparatus described above.

Other aspects may be understood upon reading and understanding of the drawings and the detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate contents of the present disclosure.

FIG. 1 is a schematic diagram of a structure of a display apparatus according to an exemplary embodiment of the present disclosure.

DETAILED DESCRIPTION

Implementations herein may be implemented in multiple different forms. Those of ordinary skills in the art can readily appreciate a fact that the implementations and contents may be varied into various forms without departing from the spirit and scope of the present disclosure. Therefore, the present disclosure should not be explained as being limited to contents described in following implementation modes only. The embodiments in the present disclosure and features in the embodiments may be combined randomly with each other without conflict.

In the accompanying drawings, a size of a constituent element, and a thickness of a layer or a region is sometimes exaggerated for clarity. Therefore, any one implementation of the present disclosure is not necessarily limited to dimensions shown in the drawings, and the shapes and sizes of the components in the accompanying drawings do not reflect actual scales. In addition, the accompanying drawings schematically show an ideal example, and any one implementation of the present disclosure is not limited to the shapes, values, or the like shown in the accompanying drawings.

Ordinal numerals such as "first", "second", and "third" herein are set to avoid confusion between constituent elements, but are not intended to limit in terms of quantity.

Herein, for convenience, wordings indicating orientations or positional relationships, such as "center", "upper", "lower", "front", "back", "vertical", "horizontal", "top", "bottom", "inside", "outside", and the like are used to describe the positional relationships between the constituent elements with reference to the accompanying drawings, and are merely for facilitating describing the implementations and simplifying the specification, rather than indicating or implying that the referred apparatuses or elements must have particular orientations, and be constructed and operated in particular orientations. Thus, they cannot be construed as a limitation on the present disclosure. The positional relationships between the constituent elements can be appropriately changed according to directions according to which the constituent elements are described. Therefore, appropriate replacements can be made according to situations without being limited to the wordings described in the specification.

Herein, unless otherwise specified and defined explicitly, terms "mount", "mutually connect", "connect" and the like should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

Herein, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

"About" herein refers to that a boundary is defined not so strictly and numerical values within process and measurement error ranges are allowed.

An embodiment of the present disclosure provides a display apparatus including a first housing, a second housing and a flexible display screen disposed on the first housing and the second housing respectively. The flexible display screen includes a rolling portion and a fixed portion connected with each other, the rolling portion is at least partially disposed on the second housing, the fixed portion is at least partially disposed on the first housing, the second housing is slidably connected with the first housing, and the rolling portion can at least partially slide out of or into the first housing following the second housing. A support structure is disposed between at least a part of the rolling portion and the second housing, and the support structure provides a support force for the rolling portion, such that when the rolling portion slides out of the first housing, a surface of the rolling portion away from the second housing is flushed with a surface of the fixed portion away from the first housing.

In the display apparatus according to the embodiment of the present disclosure, a segment difference between an outer surface of the second housing and an outer surface of the first housing when the second housing slides out of the first housing is compensated, so as to ensure that the outer surface of the rolling portion is flushed with the outer surface of the fixed portion in the flexible display screen, thereby avoiding a stamping problem of the flexible display screen occurring at the segment difference. Meanwhile, the support structure provides a support force for the flexible display screen and improves flatness of the flexible display screen.

Figure 1:
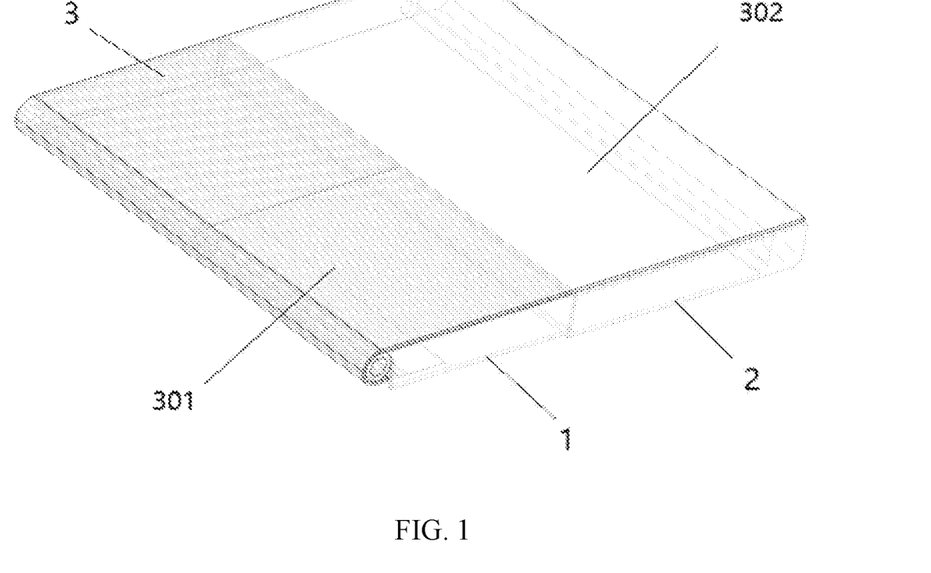
Figure 2:
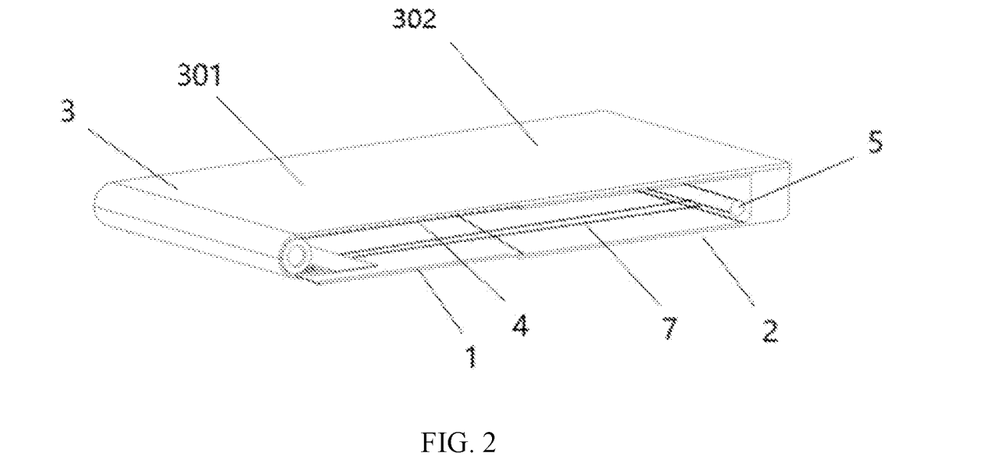
FIG. 2 is a schematic diagram of a structure of a display apparatus in serving condition according to an exemplary embodiment of the present disclosure.
Figure 3:
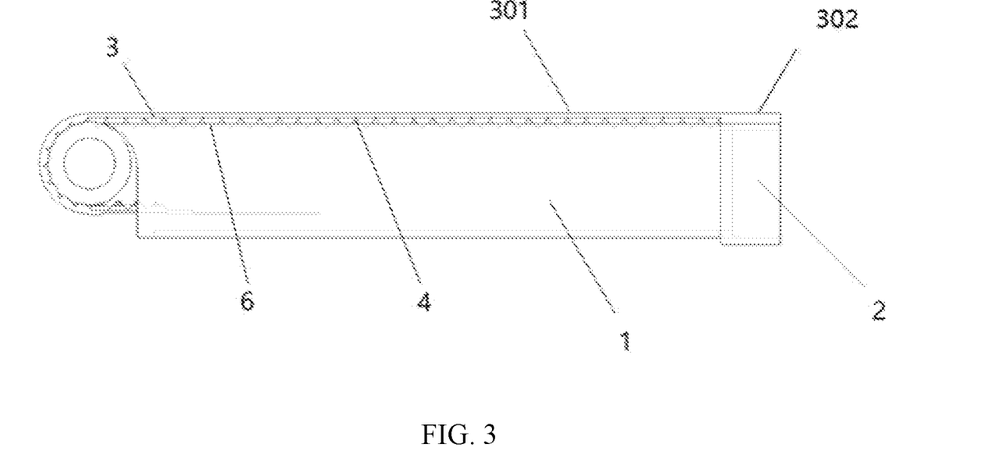
FIG. 3 is a side view of a second housing in a display apparatus according to an exemplary embodiment of the present disclosure.

As shown in FIG. 1, FIG. 2 and FIG. 3, a display apparatus provided by an embodiment of the present disclosure includes a first housing 2, a second housing 1 and a flexible display screen 3 disposed on the first housing 2 and the second housing 1 respectively. A first end of the first housing 2 is provided with an opening, and a winding assembly 5 is disposed in the first housing 2. A first end of the second housing 1 is provided with an opening, the opening of the second housing 1 is inserted into the opening of the first housing 2, and the second housing 1 is slidably connected with the first housing 2 such that the second housing 1 can slide out of or into the first housing 2. The flexible display screen 3 includes a rolling portion 301 and a fixed portion 302 connected with each other. The rolling portion 301 is capable of being rolled, and the fixed portion 302 is at least partially disposed on the first housing 2. Specifically, a first end of the fixed portion 302 is connected with an outer surface of a first side of the first housing 2, and a second end of the fixed portion 302 is connected with a first end of the rolling portion 301. The rolling portion 301 is at least partially disposed on the second housing 1. Specifically, the first end of the rolling portion 301 is connected with the second end of the fixed portion 302, and a second end of the rolling portion 301 is connected with the winding assembly 5 in the first housing 2 with bypassing an end of the second housing 1 away from the first housing 2, such that the rolling portion 301 can slide out of or into the first housing 2 following the second housing 1. A support structure 4 is disposed between at least a part of the rolling portion 301 and the outer surface of the second housing 1, and the support structure 4 provides a support force for the rolling portion 301, such that when the rolling portion 301 slides out of the first housing 1 following the second housing 1, a surface of the rolling portion 301 on the first side of the second housing 1 away from the first side of the second housing 1 is flushed with a surface of the fixed portion 302 away from the first side of the first housing 2. The first side of the second housing 1 and the first side of the first housing 2 are at a same side of the display apparatus.

The display apparatus according to the embodiment of the present disclosure is intended to solve problems that the stretchable or slidable display device is prone to a stamping problem at the segment difference and the support flatness of a stretched part of the flexible display screen cannot be ensured due to the segment difference existing between the sliding plate and the fixed plate when the display screen is stretched. In the display apparatus provided by the embodiment, the flexible display screen 3 is disposed on the first housing 2 and the second housing 1 which are slidably fitted with each other, such that a display area of the flexible display screen 3 can be changed as the second housing 1 slides in or out of the first housing 2. In addition, by disposing the support structure 4, when the second housing 1 slides out of the first housing 2, the outer surface of the rolling portion 301 of the flexible display screen 3 on the first side of the second housing 1 is flushed with the outer surface of the fixed portion 302 of the flexible display screen 3 on the first side of the first housing 2 under the act of the support force of the support structure 4, so as to eliminate the problem of segment difference. The outer surface of the rolling portion 301 and the outer surface of the fixed portion 302 refer to a surface of the rolling portion 301 away from the first side of the second housing 1 and a surface of the fixed portion 302 away from the first side of the first housing 2, respectively.

Figure 7:
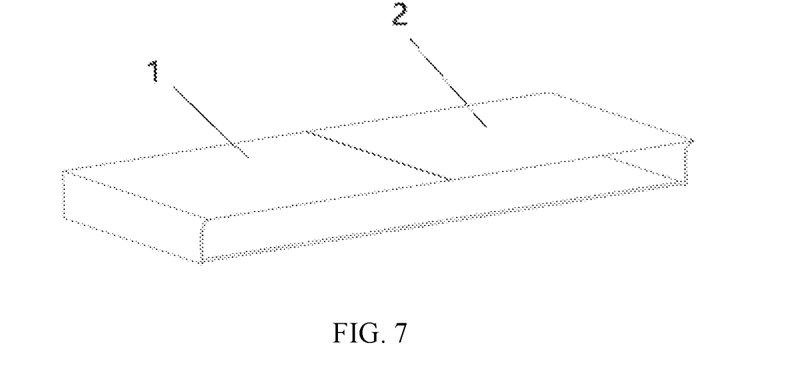
FIG. 7 is a schematic diagram of a structure of a first housing and a second housing in a display apparatus according to an exemplary embodiment of the present disclosure.

As shown in FIG. 7, the first housing 2 is a rigid structural member, which has a groove-shaped structure with an opening, for example, with a cross section in U-shape, square, round and the like. In this embodiment, it is preferred to be a groove with a a U-shaped cross section, and the thickness is reduced as much as possible on the premise of having an accommodation space to ensure that a resultant thickness of the display apparatus is small. The first housing 2 is provided therein with the winding assembly 5, wherein the winding assembly 5 has a winding function and can wind and store the rolling portion 301 of the flexible display screen 3.

As shown in FIG. 7, the second housing 1 is a rigid structural member, which has a groove-shaped structure with an opening, for example, with a cross section in U-shaped, square, round, etc. In this embodiment, it is preferred to be a groove with a U-shaped cross section. On the premise of having an accommodation space, the thickness is reduced as much as possible to ensure that a resultant thickness of the display device is small, and at the same time, a battery and other components in the first housing 2 can be avoided when sliding out/into the first housing 2. Therefore, it can be understood that a form of the second housing 1 provided without an opening also belongs to the protection scope of the present application, and the battery and other components should be disposed to avoid a sliding track of the second housing 1 at this point. In order to implement a slidable connection between the second housing 1 and the first housing 2, it is obvious that a sliding assembly (cooperation of a slide route/slide rail and a slider/pulley) is arranged between the second housing 1 and the first housing 2, and arrangement of the sliding assembly (the cooperation of the slide route/slide rail and the slider/pulley) can be easily understood and realized by those skilled in the art, which will not be described in detail here.

In the exemplary embodiment, the flexible display screen 3 is a flexible, deformable, curable display apparatus, which can be easily understood or considered by those skilled in the art, and its structure or display principle is not the protection focus of the present disclosure, which is not described in detail herein.

In an exemplary embodiment, the support structure 4 is made of a rigid material, for example, the support structure is made of a metal material. The rigid material has high support strength, which provides a stable support surface for the flexible display screen and ensures the flatness of the flexible display screen. The support structure 4 is capable of providing a support force away from the first side of the second housing 1 for the rolling portion 301 on the first side of the second housing 1 when the second housing 1 slides out of the first housing 2, such that the outer surface of the rolling portion 301 on the first side of the second housing 1 is flushed with the outer surface of the fixed portion 302 on the first side of the first housing 2.

Figure 4:
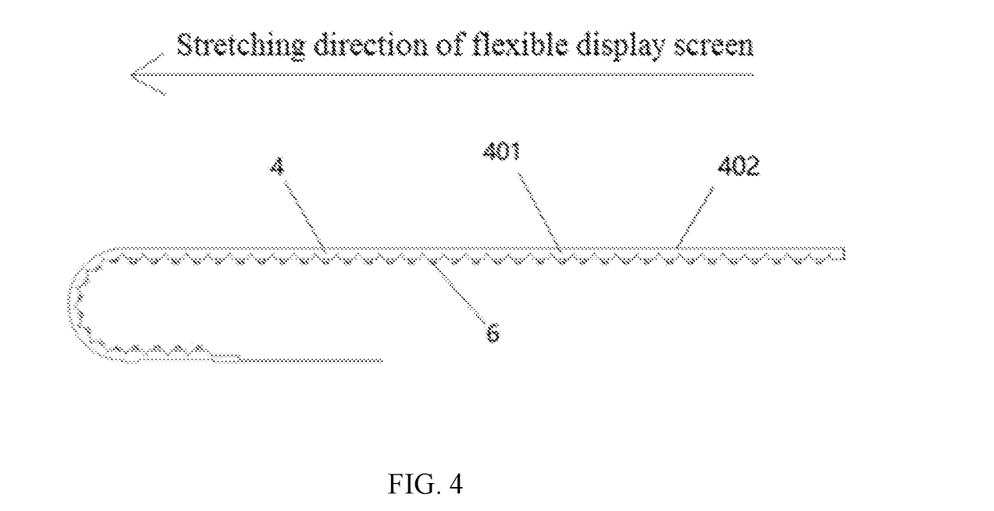
FIG. 4 is a first side view of a flexible display screen in a display apparatus according to an exemplary embodiment of the present disclosure.
Figure 5:
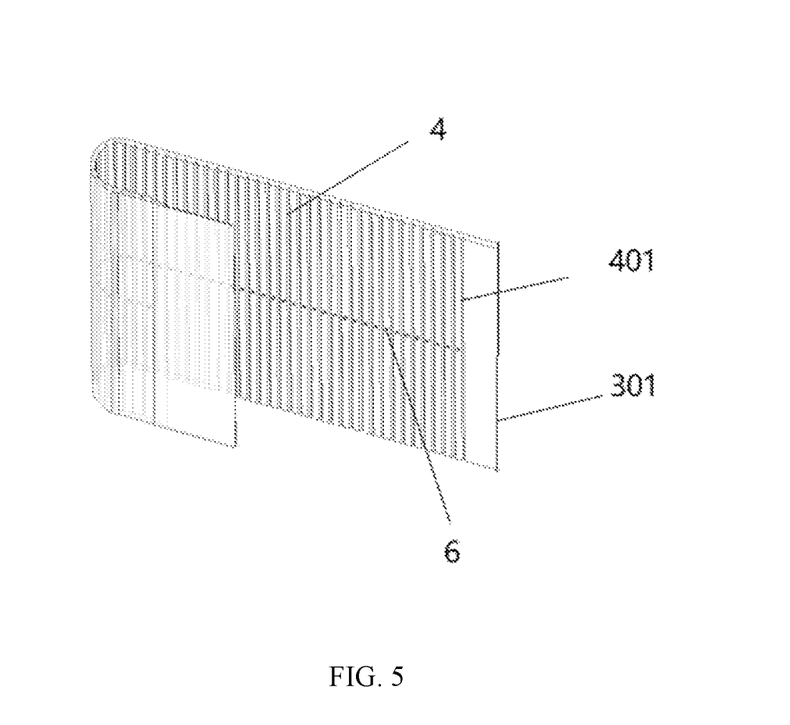
FIG. 5 is a schematic view of a structure of a surface of a flexible display screen close to a second housing side in a display apparatus according to an exemplary embodiment of the present disclosure.

As shown in FIG. 4 and FIG. 5, the support structure 4 includes at least one rigid support strip 401, wherein an extension direction of the at least one rigid support strip 401 is perpendicular to a stretching direction of the flexible display screen 3. Preferably, the rigid support strip 401 extends across the rolling portion 301 in the direction perpendicular to the stretching direction of the flexible display screen 3 to provide uniform support force for the entire flexible display screen 3.

In some embodiments, when the support structure includes one rigid support strip, the rigid support strip is disposed at a central position of the rolling portion in the stretching direction of the flexible display when the rolling portion slides out of the first housing.

As shown in FIG. 4 and FIG. 5, the support structure 4 includes at least two rigid support strips 401, wherein the rigid support strips 401 are arranged side by side along the stretching direction of the flexible display screen 3, and a rolling space is formed between adjacent rigid support strips 401, which can roll the support structure 4 and enable the support structure 4 to slide into the first housing 2 following the rolling portion 301.

As shown in FIG. 4, internal angles formed between two opposite side surfaces of the rigid support strip 401 in the stretching direction of the flexible display screen 3 and the surface of the rolling portion 301 are both obtuse angles, which are greater than 90 degrees and less than 180 degrees, and the rolling space is formed between the side surfaces of the adjacent rigid support strip 401. When the rolling portion slides out of the first housing, a cross section of each rigid support strip 401 is inverted trapezoidal, and ends of the adjacent rigid support strips 401 close a side surface of the rolling portion are in contact with each other, thereby forming a continuous support surface 402, and providing uniform support force for the flexible display screen 3.

In some embodiments, the rigid support strips are provided at intervals along the stretching direction of the flexible display screen, and the spacing therebetween forms the rolling space.

In the exemplary embodiment, the winding assembly 5 has the function of winding and storing, and can wind and store a part or all of the flexible display screen 3, such that the flexible display screen 3 is pulled out when the second housing 1 slides out of the first housing 2, and the flexible display screen 3 is stored when the second housing 1 slides into the first housing 2.

In an exemplary embodiment, the rigid support strip 401 at least has a first surface located at a side of the rigid support strip close to the rolling portion and fixedly connected with the rolling portion, such that the support structure 4 can be pulled out or stored by the winding assembly following the flexible display screen. When the support structure 4 includes at least two rigid support strips 401, the first surfaces of the adjacent rigid support strips forms a support surface 402 that provides a support force for the flexible display screen.

In an exemplary embodiment, the first surface is planar to provide uniform support force for the flexible display screen.

Figure 6:
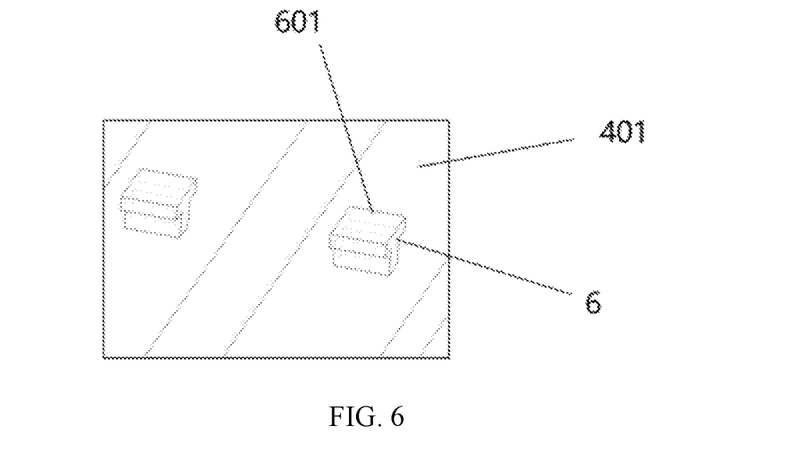
FIG. 6 is a schematic diagram of a structure of a fixed member of a flexible display screen in a display apparatus according to an exemplary embodiment of the present disclosure.

As shown in FIG. 5 and FIG. 6, a rigid support strip 401 also has a second surface located at a side of the rigid support strip 401 close to the second housing 1 and slidably connected with the outer surface of the second housing 1, such that the support structure can slide into or out of the first housing following the second housing.

As shown in FIG. 5 and FIG. 6, the second surface is provided with at least one fixing block 6, and the first side of the second housing 1 is provided with a clamping groove. When the rolling portion slides out of the first housing, the fixing block may be embedded in the clamping groove, to limit movement of the rolling portion in a direction away from the second housing, thereby the flexible display screen is prevented from arching during stretching, which will affect the display effect.

As shown in FIG. 6, the fixing block 6 includes a support member and a buckle 601 disposed at one end of the support member away from the support structure, and the buckle 601 may be embedded in the clamping groove to limit the movement of the rolling portion in the direction away from the second housing. Preferably, the fixing block 6 has a T-shaped structure.

Figure 8:
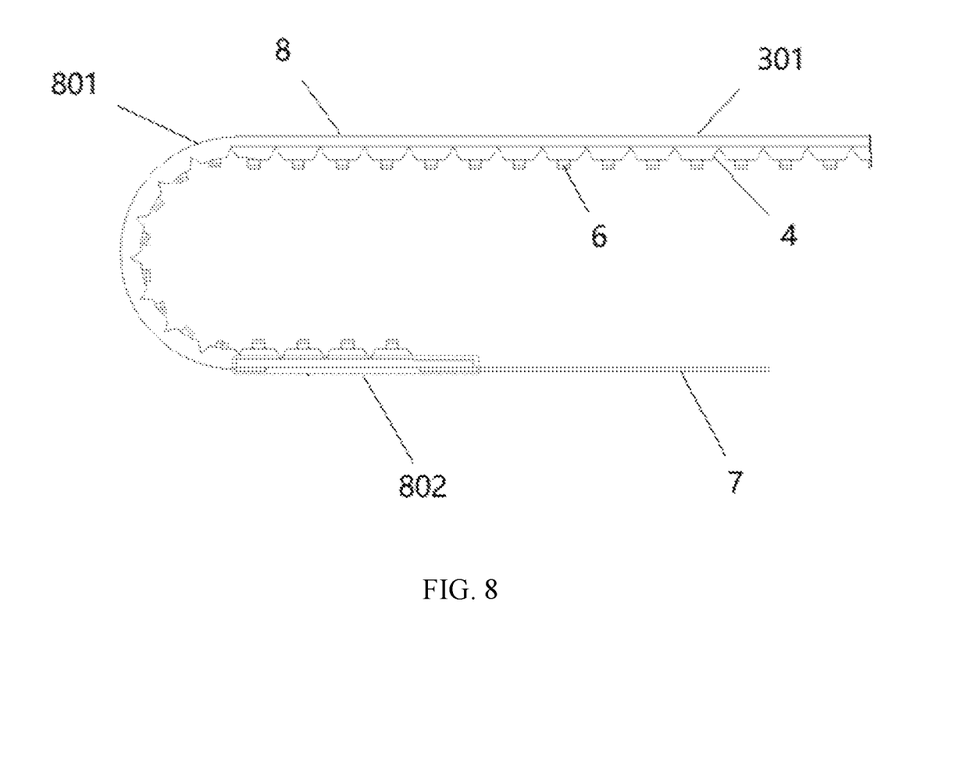
FIG. 8 is a second side view of a flexible display screen in a display apparatus according to an exemplary embodiment of the present disclosure.

As shown in FIG. 2 and FIG. 8, the display apparatus according to the embodiment of the present disclosure further includes a tensioning member 7, wherein one end of the tensioning member 7 is connected with one end of the rolling portion 301 away from the fixed portion 302, and the other end of the tensioning member 7 is connected with the winding assembly 5. The tensioning member 7 can provide a stable pulling force for the flexible display screen, such that the flexible display screen 3 is kept tight and flat during the stretching process.

Figure 9:
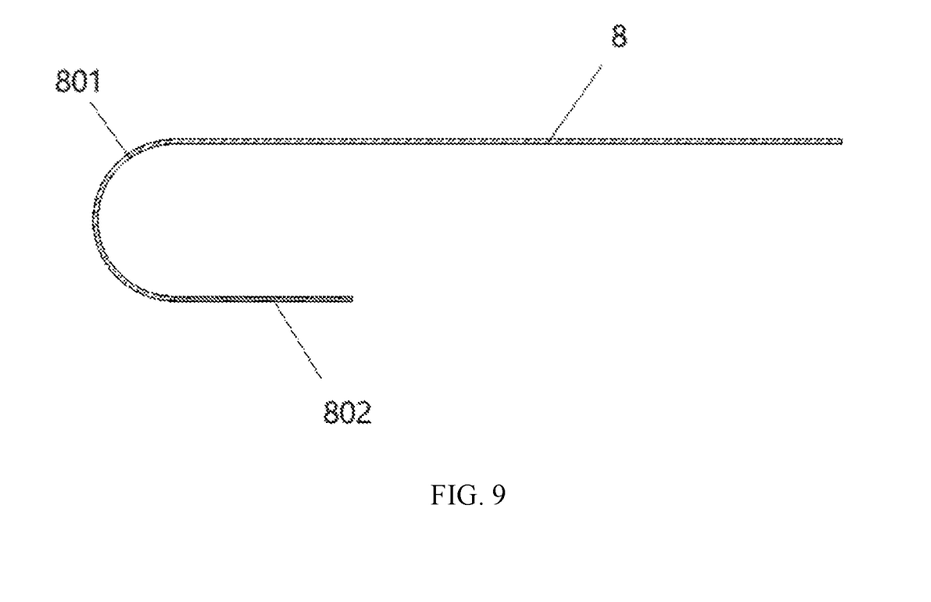
FIG. 9 is a schematic diagram of a structure of a back film of a flexible display screen in a display apparatus according to an exemplary embodiment of the present disclosure.

As shown in FIG. 8 and FIG. 9, the flexible display screen 3 includes a back film 8, wherein the back film 8 includes a rollable portion 801 and a non-rollable portion 802 connected to each other. The rollable portion 801 can be rolled and can slide out of or into the first housing following the second housing. The non-rollable portion 802 is located at one end of the flexible display screen 3 close to the winding assembly 5 and is connected with the winding assembly. The non-rollable portion 802 does not need to slide out of or into the first housing following the second housing and the non-rollable portion 802 may not be rolled. Modulus of a material of the rollable portion 801 is smaller than that of a material of the non-rollable portion 802, such that when the rollable portion 801 is rolled, strain of a display layer on the rollable portion 801 is small, and the non-rollable portion 802 can be deformed less under the pulling force of the winding assembly, without affecting the function of the display layer on the back film 8.

In an exemplary embodiment, the modulus of the material of the rollable portion 801 is 2 GPa to 5 GPa, and the modulus of the material of the non-rollable portion 802 is 6 GPa to 15 GPa, such that the pulling force of the winding assembly acts on the high-modulus non-rollable portion 802 without affecting the function of the display layer on the back film 8.

An embodiment of the present disclosure further provides a display device, including the aforementioned display apparatus. The display device in the embodiments of the present disclosure may be any product or component with a display function, such as a mobile phone, a tablet computer, a television, a display, a laptop computer, a digital photo frame, or a navigator.

In the description of the embodiments of the present disclosure, it should be understood that an orientation or a positional relation indicated by the terms "middle", "upper", "lower", "front", "rear", "vertical", "horizontal", "top", "bottom", "inner", "outer" and the like is based on the orientation or the positional relation shown in the accompanying drawings, which is only for the convenience of describing the present disclosure and simplifying the description, rather than indicating or implying that the device or the element referred to must have the specific orientation, or be constructed and operated in the specific orientation, and thus cannot be interpreted as a limitation on the present disclosure.

In the description of the embodiment of the present disclosure, it should be noted that unless otherwise specified and limited, the terms "mount", "connected" and "connect" should be understood in a broad sense. For example, a connection may be fixed connection, detachable connection or integrated connection, may be mechanical connection or electrical connection, or may be direct connection, indirect connection through intermediate medium, or communication inside two components. Those of ordinary skills in the art may understand specific meanings of these terms in the present disclosure according to specific situations.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure.

However, the scope of patent protection of the present disclosure is still subject to the scope defined by the appended claims.

The invention claimed is:

1. A display apparatus, comprising a first housing, a second housing and a flexible display screen disposed on the first housing and the second housing respectively; the flexible display screen comprises a rolling portion and a fixed portion connected with each other, the rolling portion is at least partially disposed on the second housing, the fixed portion is at least partially disposed on the first housing, the second housing is slidably connected with the first housing, and the rolling portion can at least partially slide out of or into the first housing following the second housing; a support structure is disposed between the second housing and at least a part of the rolling portion, and the support structure provides a support force for the rolling portion, such that when the rolling portion slides out of the first housing, a surface of the rolling portion away from the second housing is flushed with a surface of the fixed portion away from the first housing-, wherein the support structure comprises at least two rigid support strips, and an extending direction of the rigid support strips is perpendicular to a stretching direction of the flexible display screen, and the rigid support strips are arranged side by side along the stretching direction of the flexible display screen, and a rolling space is formed between adjacent rigid support strips, wherein the rigid support strip at least has a first surface, the first surface is located at one side of the rigid support strip close to the rolling portion and is fixedly connected with the rolling portion, and first surfaces of adjacent rigid support strips form a support surface for providing a support force for the rolling portion, wherein the rigid support strip further has a second surface, and the second surface is located at one side of the rigid support strip close to the second housing, and is slidably connected with the second housing, and the second surface is provided with at least one fixing block, and one side of the second housing close to the fixed portion of the flexible display screen is provided with a clamping groove, when the rolling portion slides out of the first housing, the fixing block is capable of being embedded in the clamping groove to limit movement of the rolling portion in a direction away from the second housing.

2. The display apparatus according to claim 1, wherein inner angles formed between two opposite side surfaces of the rigid support strip in the stretching direction of the flexible display screen and a surface of the rolling portion are obtuse angles, such that a rolling space is formed between the side surfaces of adjacent rigid support strips.

3. The display apparatus according to claim 1, wherein the first surfaces are planar.

4. The display apparatus according to claim 1, wherein the fixing block comprises a support member and a buckle disposed at one side of the support member away from the second surface, and the buckle is capable of being embedded in the clamping groove to limit the movement of the rolling portion in the direction away from the second housing.

5. The display apparatus according to claim 1, wherein the second surface is provided with one fixing block, and the fixing block is located in the middle of the rigid support strip in a direction perpendicular to the stretching direction of the flexible display screen.

6. The display apparatus according to claim 1, further comprising a tensioning member and a winding assembly arranged in the housing, one end of the tensioning member is connected with one end of the rolling portion away from the fixed portion, and the other end of the tensioning member is connected with the winding assembly.

7. The display apparatus according to claim 1, wherein the rolling portion comprises a back film, the back film comprises a rollable portion and a non-rollable portion connected with each other, and a modulus of a material of the rollable portion is smaller than a modulus of a material of the non-rollable portion.

8. The display apparatus according to claim 7, wherein the modulus of the material of the rollable portion is 2 GPa to 5 GPa, and the modulus of the material of the non-rollable portion is 6 GPa to 15 GPa.

9. A display device, comprising the display apparatus according to claim 1.

* * * * *